United States Patent
Kim (10) Patent No.: US 11,004,496 B2
(45) Date of Patent: May 11, 2021

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/590,107

(22) Filed: Oct. 1, 2019

(65) Prior Publication Data
US 2020/0350001 A1 Nov. 5, 2020

(30) Foreign Application Priority Data
May 3, 2019 (KR) .................. 10-2019-0052601

(51) Int. Cl.
| | | |
|---|---|---|
| G11C 7/00 | (2006.01) | |
| G11C 11/406 | (2006.01) | |
| G11C 11/4074 | (2006.01) | |
| G11C 11/4076 | (2006.01) | |
| G11C 8/18 | (2006.01) | |
| G11C 29/02 | (2006.01) | |

(52) U.S. Cl.
CPC .......... *G11C 11/40615* (2013.01); *G11C 8/18* (2013.01); *G11C 11/406* (2013.01); *G11C 11/4074* (2013.01); *G11C 11/4076* (2013.01); *G11C 29/02* (2013.01)

(58) Field of Classification Search
CPC ............ G11C 11/40615; G11C 11/406; G11C 11/4076; G11C 29/02; G11C 11/4074; G11C 8/18
See application file for complete search history.

(56) References Cited

U.S. PATENT DOCUMENTS

| | | | | |
|---|---|---|---|---|
| 6,842,373 B2* | 1/2005 | La | .......................... | G11C 11/406 365/185.04 |
| 7,061,826 B2* | 6/2006 | Yang | .................... | G11C 7/1072 365/185.19 |
| 2015/0109872 A1 | 4/2015 | Sakakibara et al. | | |
| 2019/0317699 A1* | 10/2019 | Hong | .................... | G06F 3/0659 |

FOREIGN PATENT DOCUMENTS

KR 1020190031913 A 3/2019

* cited by examiner

*Primary Examiner* — Pho M Luu
(74) *Attorney, Agent, or Firm* — William Park & Associates Ltd.

(57) ABSTRACT

A semiconductor device includes a command decoder and a period signal generation circuit. The command decoder generates a first entry command and a first exit command based on a first internal chip selection signal and a first internal control signal and generates a second entry command and a second exit command based on a second internal chip selection signal and a second internal control signal. The period signal generation circuit generates a period signal based on the first entry command, the second entry command, the first exit command, the second exit command, and the period signal.

22 Claims, 11 Drawing Sheets

SEMICONDUCTOR DEVICES

CROSS-REFERENCE TO RELATED APPLICATIONS

The present application claims priority under 35 U.S.C 119(a) to Korean Application No. 10-2019-0052601, filed on May 3, 2019, which is incorporated herein by reference in its entirety.

BACKGROUND

1. Technical Field

Embodiments of the present disclosure relate to semiconductor devices, and more particularly, semiconductor devices controlling an internal operation.

2. Related Art

Unlike static random access random (SRAM) devices and flash memory devices, dynamic random access random (DRAM) devices of semiconductor devices, despite a continuous power supply, can lose their stored data as time elapses. This may occur due to the current leakage of cell capacitors, constituting memory cells of the DRAM devices together with cell transistors. Thus, the cell capacitors of the DRAM devices have to be periodically recharged to retain or refresh their stored data. The operation for recharging the cell capacitors may be referred to as a refresh operation. The refresh operation may be performed by activating a word line, which may occur at least once within a data retention time of the memory cells to amplify the data stored in the memory cells. The data retention time may correspond to a maximum time that the cell capacitors can retain minimum charges, which are required to reveal correct logic data without any refresh operations.

The refresh operation may be categorized as either an auto-refresh operation or a self-refresh operation. The auto-refresh operation may be executed by a refresh command outputted from a controller that controls the DRAM devices, and the self-refresh operation may be executed by counters included in the DRAM devices in a power down mode.

SUMMARY

According to an embodiment, a semiconductor device includes a command decoder and a period signal generation circuit. The command decoder generates a first entry command and a first exit command based on a first internal chip selection signal and a first internal control signal. The command decoder also generates a second entry command and a second exit command based on a second internal chip selection signal and a second internal control signal. The period signal generation circuit generates a period signal based on the first entry command, the second entry command, the first exit command, the second exit command, and the period signal.

According to another embodiment, a semiconductor device includes a first exit signal generation circuit, a second exit signal generation circuit, and a period signal drive circuit. The first exit signal generation circuit generates a first exit signal which is enabled when a first connection signal and a second connection signal are sequentially generated while a period signal is enabled, wherein the first connection signal is generated from a first exit command, and the second connection signal is generated from a second exit command. The second exit signal generation circuit generates a second exit signal which is enabled when the second connection signal and the first connection signal are sequentially generated while the period signal is enabled. The period signal drive circuit generates a disabled period signal based on the first exit signal and the second exit signal.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being, for example, "between" two elements, it can be the only element between the two elements, or one or more intervening elements may also be present. Like reference numerals refer to like elements throughout.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

The embodiments according to the concept of the present disclosure can be modified in various ways and have various shapes. Thus, the embodiments are illustrated in the drawings and are intended to be described herein in detail.

However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Figure 1:
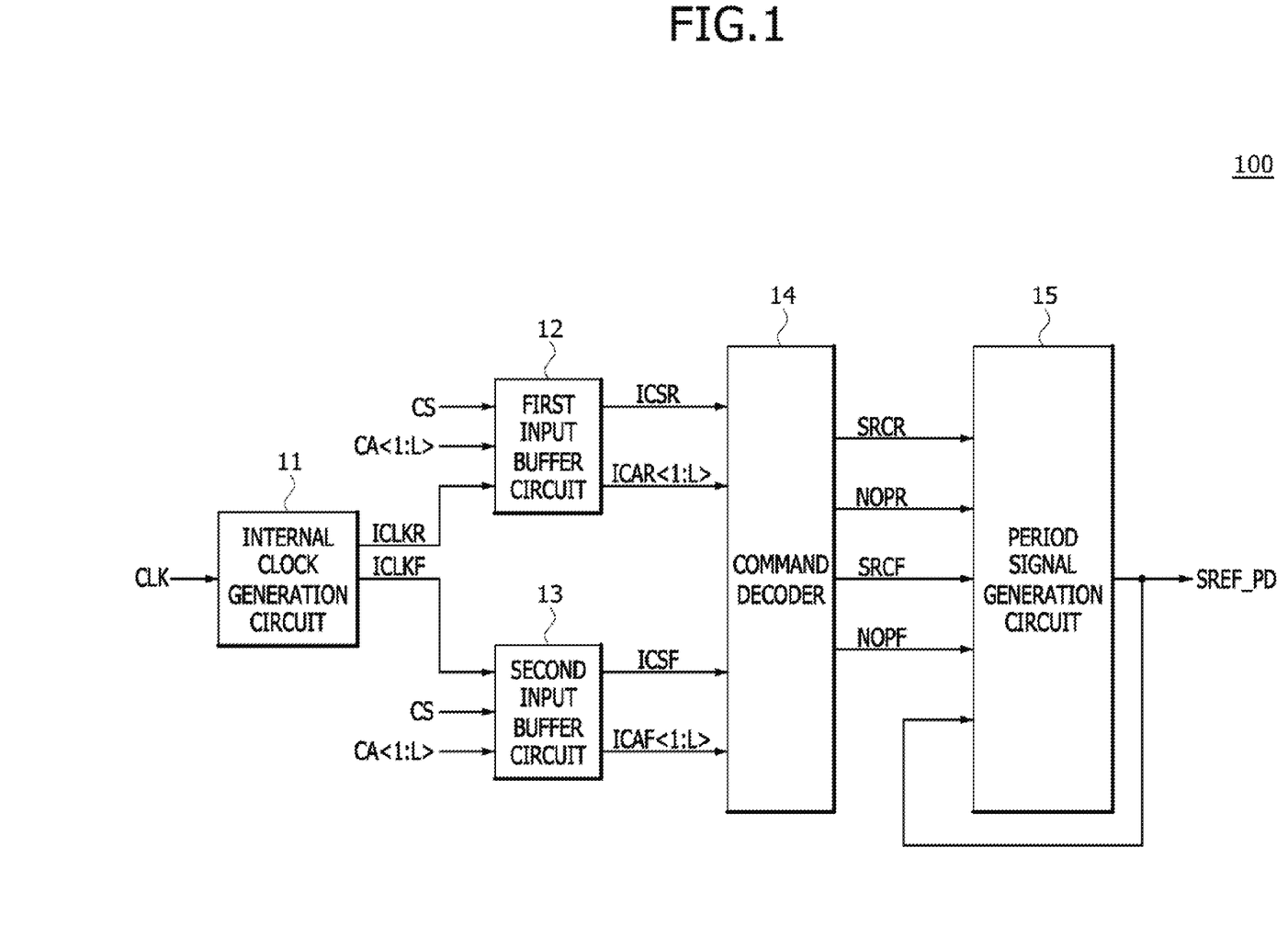
FIG. 1 is a block diagram, illustrating a configuration of a semiconductor device, according to an embodiment of the present disclosure.

As illustrated in FIG. 1, a semiconductor device 100, according to an embodiment, may include an internal clock generation circuit 11, a first input buffer circuit 12, a second input buffer circuit 13, a command decoder 14, and a period signal generation circuit 15.

The internal clock generation circuit 11 may generate a first internal clock signal ICLKR and a second internal clock signal ICLKF based on a clock signal CLK. The internal clock generation circuit 11 may divide the clock signal CLK to generate the first internal clock signal ICLKR and the second internal clock signal ICLKF. A cycle time of the first and second internal clock signals ICLKR and ICLKF may be set to be twice the cycle time of the clock signal CLK. The phase of the second internal clock signal ICLKF may be inverted in relation to the phase of the first internal clock signal ICLKR. The phases and the cycle times of the first and second internal clock signals ICLKR and ICLKF may be set to be different according to the embodiments.

The first input buffer circuit 12 may generate a first internal chip selection signal ICSR and a first internal control signal ICAR<1:L> from a chip selection signal CS and an external control signal CA<1:L> based on the first internal clock signal ICLKR. The first input buffer circuit 12 may buffer the chip selection signal CS to generate the first internal chip selection signal ICSR in synchronization with a point in time (hereinafter, referred to as 'a rising edge' of the first internal clock signal ICLKR) when a level of the first internal clock signal ICLKR is changed from a logic "low" level into a logic "high" level. The first input buffer circuit 12 may buffer the external control signal CA<1:L> to generate the first internal control signal ICAR<1:L> in synchronization with a rising edge of the first internal clock signal ICLKR. In some other embodiments, the first input buffer circuit 12 may generate the first internal chip selection signal ICSR and the first internal control signal ICAR<1:L> from the chip selection signal CS and the external control signal CA<1:L> in synchronization with a point in time (hereinafter, referred to as 'a falling edge' of the first internal clock signal ICLKR) when a level of the first internal clock signal ICLKR is changed from a logic "high" level into a logic "low" level.

The second input buffer circuit 13 may generate a second internal chip selection signal ICSF and a second internal control signal ICAF<1:L> from the chip selection signal CS and the external control signal CA<1:L> based on the second internal clock signal ICLKF. The second input buffer circuit 13 may buffer the chip selection signal CS in synchronization with a rising edge of the second internal clock signal ICLKF to generate the second internal chip selection signal ICSF. The second input buffer circuit 13 may buffer the external control signal CA<1:L> in synchronization with a rising edge of the second internal clock signal ICLKF to generate the second internal control signal ICAF<1:L>. In some embodiments, the second input buffer circuit 13 may generate the second internal chip selection signal ICSF and the second internal control signal ICAF<1:L> based on the chip selection signal CS and the external control signal CA<1:L> in synchronization with a falling edge of the second internal clock signal ICLKF.

The command decoder 14 may generate a first entry command SRCR and a first exit command NOPR based on the first internal chip selection signal ICSR and the first internal control signal ICAR<1:L>. The command decoder 14 may decode the first internal control signal ICAR<1:L>, in synchronization with the first internal chip selection signal ICSR, to generate the first entry command SRCR and the first exit command NOPR. The command decoder 14 may be synchronized with the first internal chip selection signal ICSR to generate the first entry command SRCR, which is enabled when the first internal control signal ICAR<1:L>, having a first logic level combination, is received by the command decoder 14. The first entry command SRCR may be enabled to activate a refresh operation. The command decoder 14 may be synchronized with the first internal chip selection signal ICSR to generate the first exit command NOPR, which is enabled when the first internal control signal ICAR<1:L>, having a second logic level combination is received by the command decoder 14. The first exit command NOPR may be enabled to deactivate the refresh operation. The first entry command SRCR and the first exit command NOPR may be enabled to perform various internal operations according to the embodiments. The first and second logic level combinations of the first internal control signal ICAR<1:L> may be set to be different according to the embodiments.

The command decoder 14 may generate a second entry command SRCF and a second exit command NOPF based on the second internal chip selection signal ICSF and the second internal control signal ICAF<1:L>. The command decoder 14 may decode the second internal control signal ICAF<1:L>, in synchronization with the second internal chip selection signal ICSF, to generate the second entry command SRCF and the second exit command NOPF. The command decoder 14 may be synchronized with the second internal chip selection signal ICSF to generate the second entry command SRCF, which is enabled when the second internal control signal ICAF<1:L>, having a third logic level combination is received by the command decoder 14. The second entry command SRCF may be enabled to activate the refresh operation. The command decoder 14 may be synchronized with the second internal chip selection signal ICSF to generate the second exit command NOPF, which is enabled when the second internal control signal ICAF<1:L>, having a fourth logic level combination is received by the command decoder 14. The second exit command NOPF may be enabled to deactivate the refresh operation. The second entry command SRCF and the second exit command NOPF may be enabled to perform various internal operations according to the embodiments. The third and fourth logic level combinations of the second internal control signal ICAF<1:L> may be set to be different according to the embodiments. An embodiment, illustrating the configuration and the operation of the command decoder 14, will be described more fully with reference to FIG. 2.

The period signal generation circuit 15 may generate a period signal SREF_PD based on the first entry command SRCR, the first exit command NOPR, the second entry command SRCF, the second exit command NOPF, and the period signal SREF_PD. The period signal generation circuit 15 may generate the period signal SREF_PD, which is enabled when the first entry command SRCR or the second entry command SRCF is generated. The period signal generation circuit 15 may generate a disabled period signal SREF_PD when the first exit command NOPR and the second exit command NOPF are sequentially generated while the period signal SREF_PD is enabled. The period signal generation circuit 15 may generate the disabled period signal SREF_PD when the first exit command NOPR, the second exit command NOPF, and the first exit command NOPR are sequentially generated while the period signal SREF_PD is enabled. The period signal generation circuit 15 may generate the disabled period signal SREF_PD when the second exit command NOPF and the first exit command NOPR are sequentially generated while the period signal SREF_PD is enabled. The period signal generation circuit 15 may generate the disabled period signal SREF_PD when the second exit command NOPF, the first exit command NOPR, and the second exit command NOPF are sequentially generated while the period signal SREF_PD is enabled. A logic level of the enabled period signal SREF_PD and a logic level of the disabled period signal SREF_PD may be set to be different according to the embodiments. A period that the period signal SREF_PD is enabled may equate to a period that the refresh operation, including a self-refresh operation, is performed. An embodiment, illustrating the configuration and the operation of the period signal generation circuit 15, will be described more fully with reference to FIGS. 3 to 8.

Figure 2:
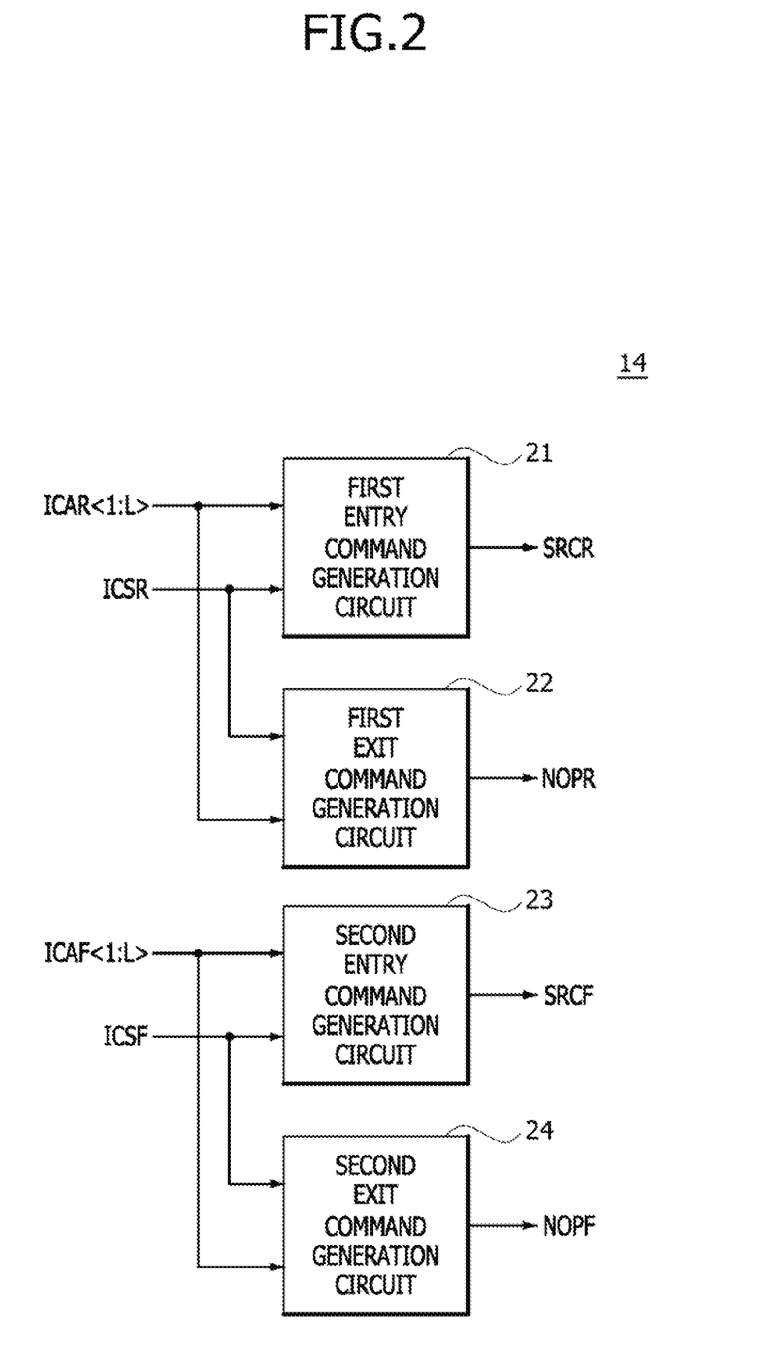
FIG. 2 is a block diagram, illustrating an example of a command decoder, included in the semiconductor device of FIG. 1.

Referring to FIG. 2, the command decoder 14 may include a first entry command generation circuit 21, a first exit command generation circuit 22, a second entry command generation circuit 23, and a second exit command generation circuit 24. The first entry command generation circuit 21 may be synchronized with a rising edge of the first internal chip selection signal ICSR to generate the first entry command SRCR, which is enabled when the first internal control signal ICAR<1:L>, having the first logic level combination is received by the first entry command generation circuit 21. The first entry command SRCR may be enabled to activate the refresh operation. The first exit command generation circuit 22 may be synchronized with a rising edge of the first internal chip selection signal ICSR to generate the first exit command NOPR, which is enabled when the first internal control signal ICAR<1:L>, having the second logic level combination is received by the first exit command generation circuit 22. The first exit command NOPR may be enabled to deactivate the refresh operation. The second entry command generation circuit 23 may be synchronized with a rising edge of the second internal chip selection signal ICSF to generate the second entry command SRCF, which is enabled when the second internal control signal ICAF<1:L>, having the third logic level combination is received by the second entry command generation circuit 23. The second entry command SRCF may be enabled to activate the refresh operation. The second exit command generation circuit 24 may be synchronized with a rising edge of the second internal chip selection signal ICSF to generate the second exit command NOPF, which is enabled when the second internal control signal ICAF<1:L>, having the fourth logic level combination is received by the second exit command generation circuit 24. The second exit command NOPF may be enabled to deactivate the refresh operation. In the present embodiment, the first and third logic level combinations may be set to be identical to each other, and the second and fourth logic level combinations may be set to be identical to each other.

Figure 3:
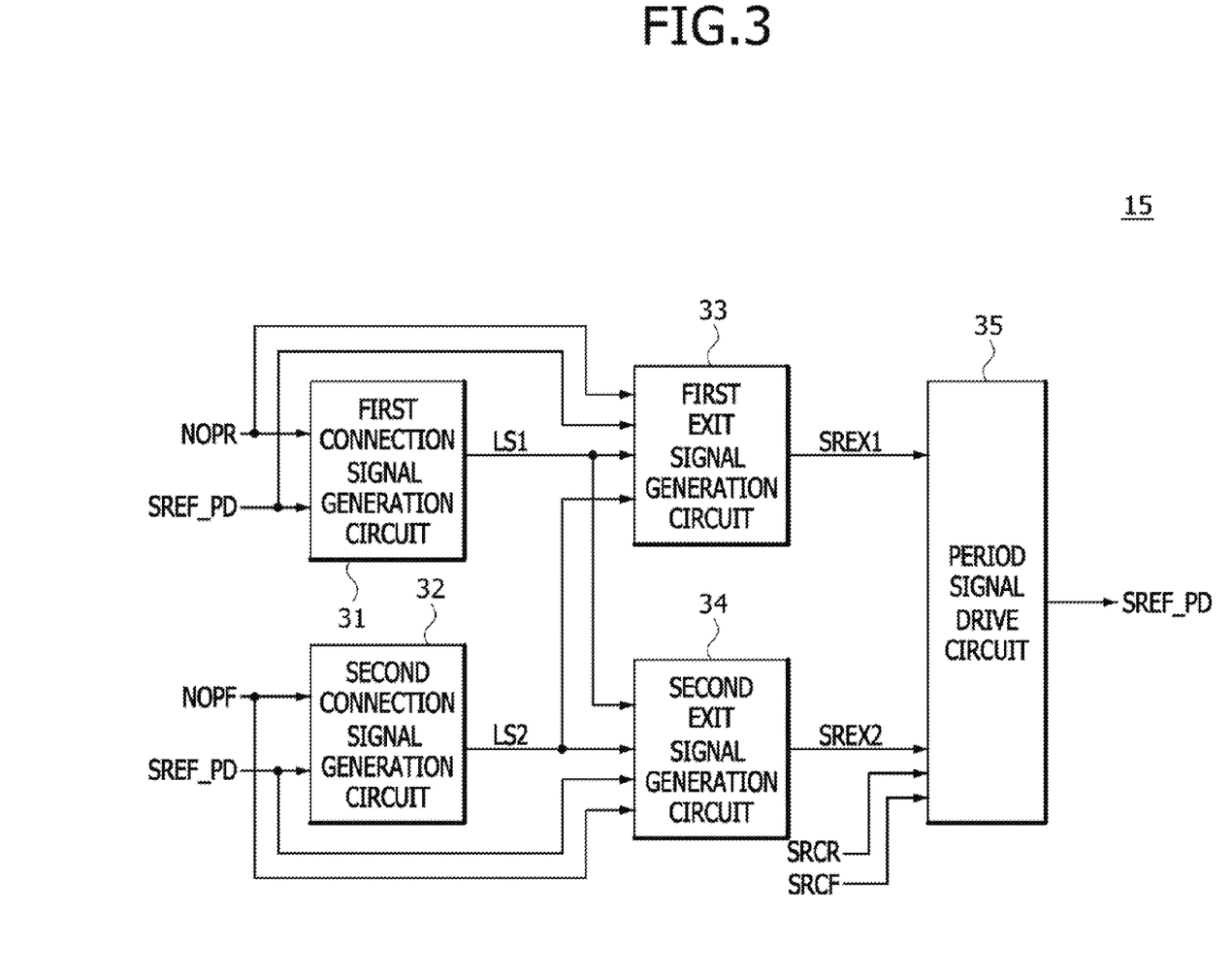
FIG. 3 is a block diagram, illustrating an example of a period signal generation circuit, included in the semiconductor device of FIG. 1.

Referring to FIG. 3, the period signal generation circuit 15 may include a first connection signal generation circuit 31, a second connection signal generation circuit 32, a first exit signal generation circuit 33, a second exit signal generation circuit 34, and a period signal drive circuit 35.

The first connection signal generation circuit 31 may generate a first connection signal LS1 from the first exit command NOPR based on the period signal SREF_PD. The first connection signal generation circuit 31 may buffer the first exit command NOPR to generate the first connection signal LS1 while the period signal SREF_PD is enabled. An embodiment, illustrating the configuration and the operation of the first connection signal generation circuit 31, will be described more fully with reference to FIG. 4.

The second connection signal generation circuit 32 may generate a second connection signal LS2 from the second exit command NOPF based on the period signal SREF_PD. The second connection signal generation circuit 32 may buffer the second exit command NOPF to generate the second connection signal LS2 while the period signal SREF_PD is enabled. An embodiment, illustrating the configuration and the operation of the second connection signal generation circuit 32, will be described more fully with reference to FIG. 5.

The first exit signal generation circuit 33 may generate a first exit signal SREX1 based on the period signal SREF_PD, the first exit command NOPR, the first connection signal LS1, and the second connection signal LS2. The first exit signal generation circuit 33 may successively latch the first exit command NOPR in sequential synchronization with the first connection signal LS1, the second connection signal LS2, and the first connection signal LS1 to generate the first exit signal SREX1, while the period signal SREF_PD is enabled. An embodiment, illustrating the configuration and the operation of the first exit signal generation circuit 33, will be described more fully with reference to FIG. 6.

The second exit signal generation circuit 34 may generate a second exit signal SREX2 based on the period signal SREF_PD, the second exit command NOPF, the first connection signal LS1, and the second connection signal LS2. The second exit signal generation circuit 34 may successively latch the second exit command NOPF in sequential synchronization with the second connection signal LS2, the first connection signal LS1, and the second connection signal LS2 to generate the second exit signal SREX2, while the period signal SREF_PD is enabled. An embodiment, illustrating the configuration and the operation of the second exit signal generation circuit 34, will be described more fully with reference to FIG. 7.

The period signal drive circuit 35 may generate the period signal SREF_PD based on the first entry command SRCR, the second entry command SRCF, the first exit signal SREX1, and the second exit signal SREX2. The period signal drive circuit 35 may generate the period signal SREF_PD, which is enabled when the first entry command SRCR or the second entry command SRCF is enabled. The period signal drive circuit 35 may generate the disabled period signal SREF_PD when the first exit signal SREX1 or the second exit signal SREX2 is enabled. An embodiment, illustrating the configuration and the operation of the period signal drive circuit 35, will be described more fully with reference to FIG. 8.

Figure 4:
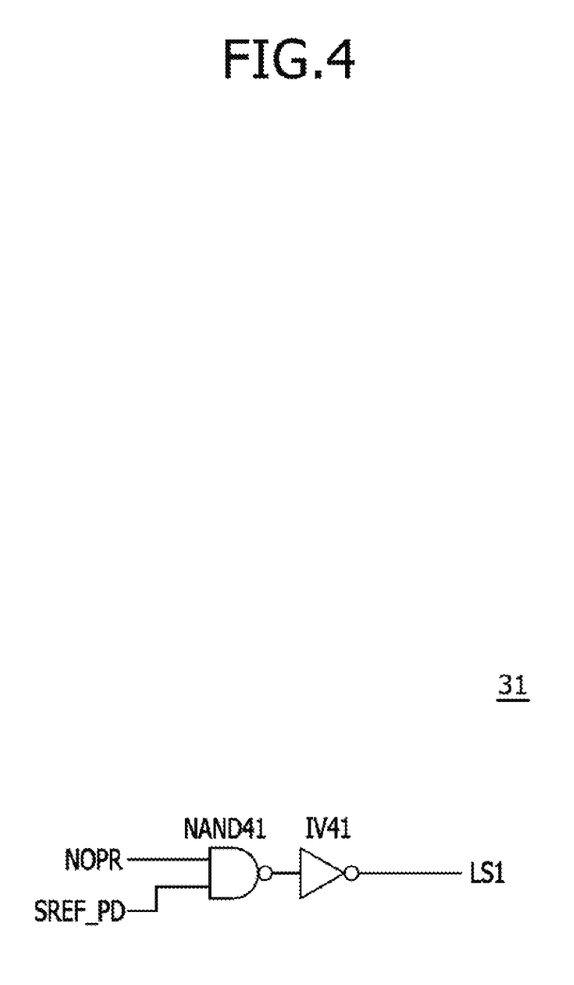
FIG. 4 is a circuit diagram, illustrating an example of a first connection signal generation circuit, included in the period signal generation circuit of FIG. 3.

Referring to FIG. 4, the first connection signal generation circuit 31 may be configured to perform a NAND operation and an inversion operation. For example, the first connection signal generation circuit 31 may include a NAND gate NAND41 and an inverter IN41 which are coupled in series. The first connection signal generation circuit 31 may receive the period signal SREF_PD and the first exit command NOPR to perform a logical NAND operation and a logical inversion operation. The first connection signal generation circuit 31 may buffer the first exit command NOPR to output the buffered signal of the first exit command NOPR as the first connection signal LS1 while the period signal SREF_PD is enabled to have a logic "high" level.

Figure 5:
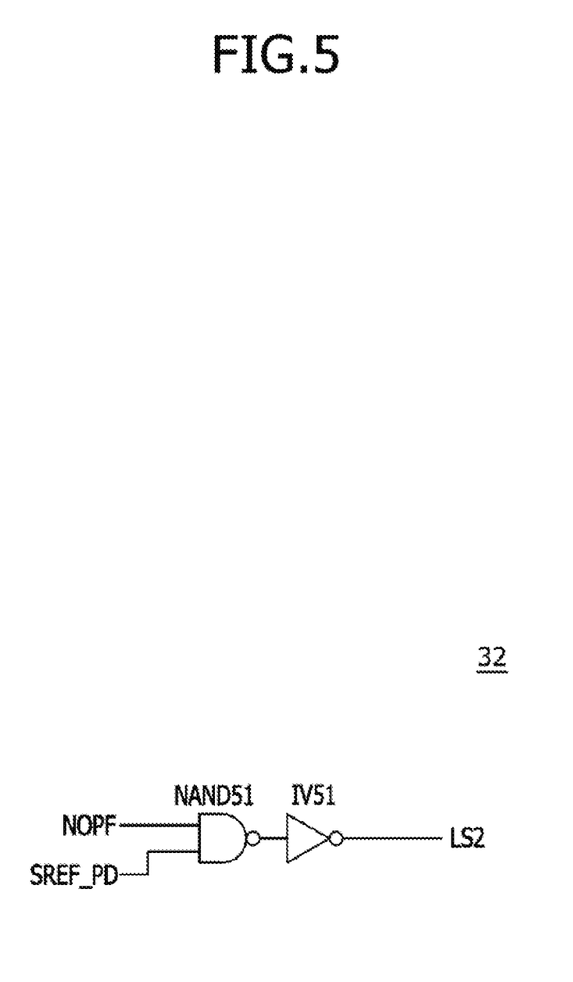
FIG. 5 is a circuit diagram, illustrating an example of a second connection signal generation circuit, included in the period signal generation circuit of FIG. 3.

Referring to FIG. 5, the second connection signal generation circuit 32 may be configured to perform a NAND operation and an inversion operation. For example, the second connection signal generation circuit 32 may include a NAND gate NAND51 and an inverter IN51 which are coupled in series. The second connection signal generation circuit 32 may receive the period signal SREF_PD and the second exit command NOPF to perform a logical NAND operation and a logical inversion operation. The second connection signal generation circuit 32 may buffer the second exit command NOPF to output the buffered signal of the second exit command NOPF as the second connection signal LS2 while the period signal SREF_PD is enabled to have a logic "high" level.

Figure 6:
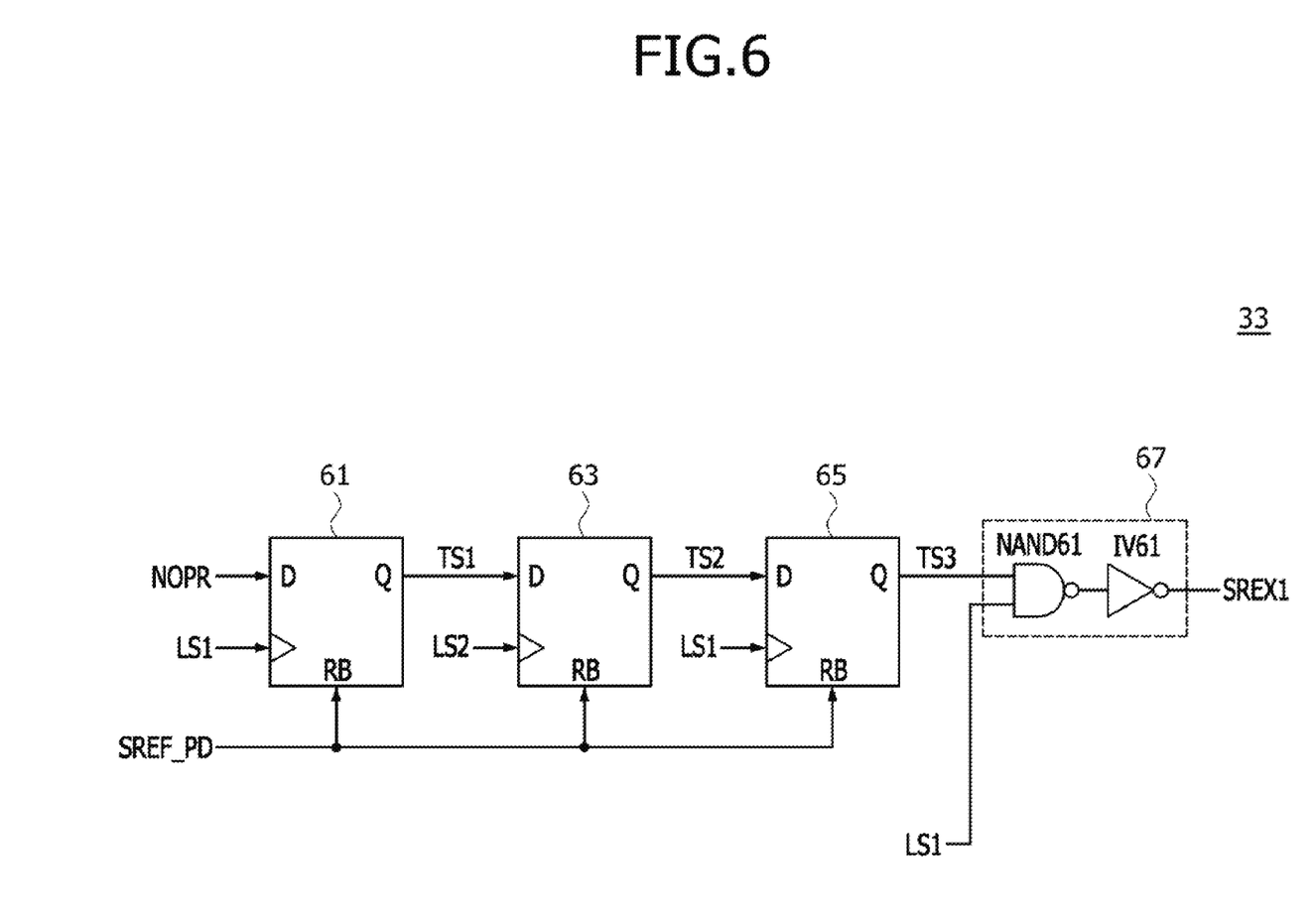
FIG. 6 is a circuit diagram, illustrating an example of a first exit signal generation circuit, included in the period signal generation circuit of FIG. 3.

Referring to FIG. 6, the first exit signal generation circuit 33 may include a first transfer signal latch 61, a second transfer signal latch 63, a third transfer signal latch 65, and a first exit signal output circuit 67.

The first transfer signal latch 61 may include a D-flip flop. The first transfer signal latch 61 may initialize a first transfer signal TS1 to a logic "low" level while the period signal SREF_PD is disabled to have a logic "low" level. The first transfer signal latch 61 may be synchronized with a rising edge of the first connection signal LS1 to latch the first exit command NOPR and may output the latched signal of the first exit command NOPR as the first transfer signal TS1, while the period signal SREF_PD is enabled to have a logic "high" level.

The second transfer signal latch 63 may include a D-flip flop. The second transfer signal latch 63 may initialize a second transfer signal TS2 to a logic "low" level while the period signal SREF_PD is disabled to have a logic "low" level. The second transfer signal latch 63 may be synchronized with a rising edge of the second connection signal LS2 to latch an output signal (i.e., the first transfer signal TS1) of the first transfer signal latch 61 and may output the latched output signal of the first transfer signal latch 61 as the second transfer signal TS2, while the period signal SREF_PD is enabled to have a logic "high" level.

The third transfer signal latch 65 may include a D-flip flop. The third transfer signal latch 65 may initialize a third transfer signal TS3 to a logic "low" level while the period signal SREF_PD is disabled to have a logic "low" level. The third transfer signal latch 65 may be synchronized with a rising edge of the first connection signal LS1 to latch an output signal (i.e., the second transfer signal TS2) of the second transfer signal latch 63 and may output the latched output signal of the second transfer signal latch 63 as the third transfer signal TS3, while the period signal SREF_PD is enabled to have a logic "high" level.

The first exit signal output circuit 67 may be configured to perform a NAND operation and an inversion operation. For example, the first exit signal output circuit 67 may include a NAND gate NAND61 and an inverter IV61 which are coupled in series. The first exit signal output circuit 67 may receive the third transfer signal TS3 and the first connection signal LS1 to perform a logical NAND operation and a logical inversion operation. The first exit signal output circuit 67 may buffer the third transfer signal TS3 to output the buffered signal of the third transfer signal TS3 as the first exit signal SREX1 while the first connection signal LS1 is enabled to have a logic "high" level.

The first exit signal generation circuit 33 may successively latch the first exit command NOPR in sequential synchronization with a rising edge of the first connection signal LS1, a rising edge of the second connection signal LS2, and a rising edge of the first connection signal LS1 to generate the first exit signal SREX1, which is enabled to have a logic "high" level, while the period signal SREF_PD is enabled to have a logic "high" level.

Figure 7:
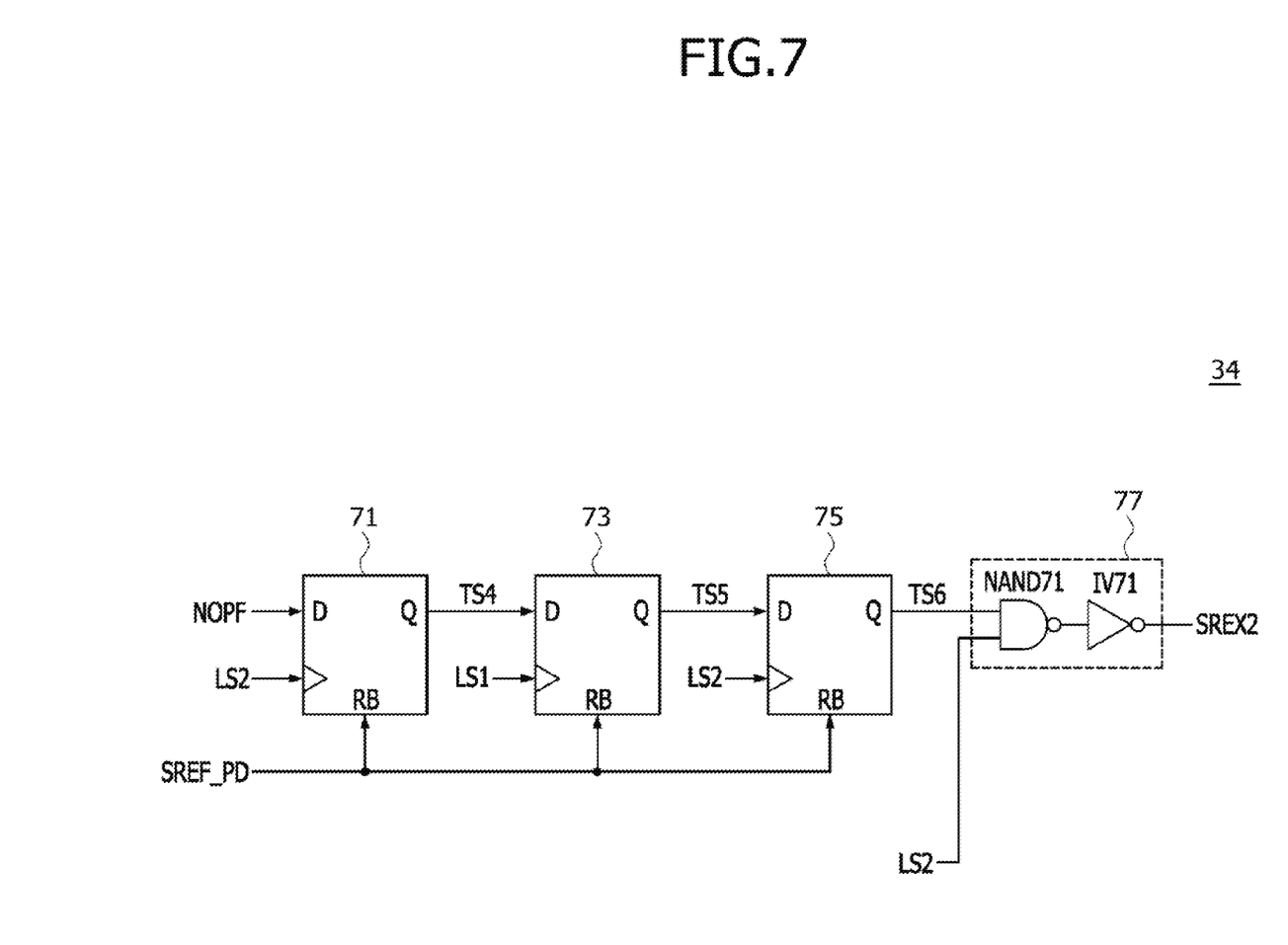
FIG. 7 is a circuit diagram, illustrating an example of a second exit signal generation circuit, included in the period signal generation circuit of FIG. 3.

Referring to FIG. 7, the second exit signal generation circuit 34 may include a fourth transfer signal latch 71, a fifth transfer signal latch 73, a sixth transfer signal latch 75, and a second exit signal output circuit 77.

The fourth transfer signal latch 71 may include a D-flip flop. The fourth transfer signal latch 71 may initialize a fourth transfer signal TS4 to a logic "low" level while the period signal SREF_PD is disabled to have a logic "low" level. The fourth transfer signal latch 71 may be synchronized with a rising edge of the second connection signal LS2 to latch the second exit command NOPF and may output the latched signal of the second exit command NOPF as the fourth transfer signal TS4, while the period signal SREF_PD is enabled to have a logic "high" level.

The fifth transfer signal latch 73 may include a D-flip flop. The fifth transfer signal latch 73 may initialize a fifth transfer signal TS5 to a logic "low" level while the period signal SREF_PD is disabled to have a logic "low" level. The fifth transfer signal latch 73 may be synchronized with a rising edge of the first connection signal LS1 to latch an output signal (i.e., the fourth transfer signal TS4) of the fourth transfer signal latch 71 and may output the latched signal of the output signal of the fourth transfer signal latch 71 as the fifth transfer signal TS5, while the period signal SREF_PD is enabled to have a logic "high" level.

The sixth transfer signal latch 75 may include a D-flip flop. The sixth transfer signal latch 75 may initialize a sixth transfer signal TS6 to a logic "low" level while the period signal SREF_PD is disabled to have a logic "low" level. The sixth transfer signal latch 75 may be synchronized with a rising edge of the second connection signal LS2 to latch an output signal (i.e., the fifth transfer signal TS5) of the fifth transfer signal latch 73 and may output the latched signal of the output signal of the fifth transfer signal latch 73 as the sixth transfer signal TS6, while the period signal SREF_PD is enabled to have a logic "high" level.

The second exit signal output circuit 77 may be configured to perform a NAND operation and an inversion operation. For example, the second exit signal output circuit 77 may include a NAND gate NAND71 and an inverter IV71 which are coupled in series. The second exit signal output circuit 77 may receive the sixth transfer signal TS6 and the second connection signal LS2 to sequentially perform a logical NAND operation and a logical inversion operation. The second exit signal output circuit 77 may buffer the sixth transfer signal TS3 to output the buffered signal of the sixth transfer signal TS6 as the second exit signal SREX2 while the second connection signal LS2 is enabled to have a logic "high" level.

The second exit signal generation circuit 34 may successively latch the second exit command NOPF in sequential synchronization with a rising edge of the second connection signal LS2, a rising edge of the first connection signal LS1, and a rising edge of the second connection signal LS2 to generate the second exit signal SREX2, which is enabled to have a logic "high" level, while the period signal SREF_PD is enabled to have a logic "high" level.

Figure 8:
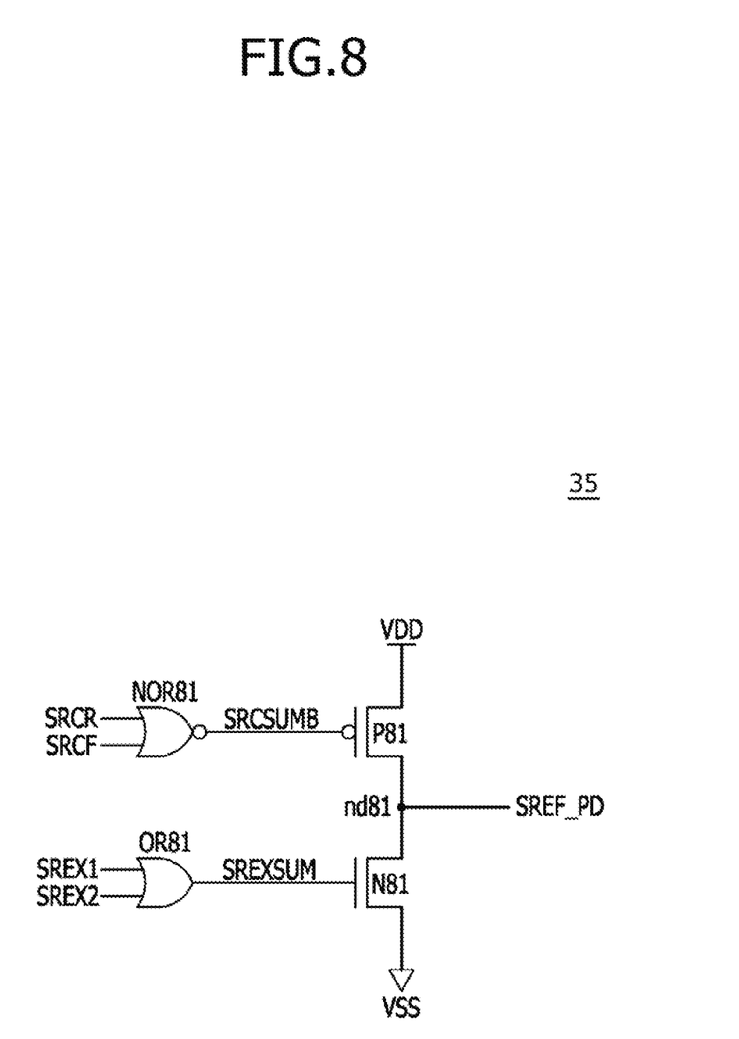
FIG. 8 is a circuit diagram, illustrating an example of a period signal drive circuit, included in the period signal generation circuit of FIG. 3.

Referring to FIG. 8, the period signal drive circuit 35 may be configured to perform a NOR operation and an OR operation. For example, the period signal drive circuit 35 may include a NOR gate NOR81, an OR gate OR81, a PMOS transistor P81, and an NMOS transistor N81. The NOR gate NOR81 may perform a logical NOR operation of the first entry command SRCR and the second entry command SRCF to generate a synthesis entry signal SRCSUMB. The NOR gate NOR81 may generate the synthesis entry signal SRCSUMB, which is enabled to have a logic "low" level when the first entry command SRCR or the second entry command SRCF is enabled to have a logic "high" level. The OR gate OR81 may perform a logical OR operation of the first exit signal SREX1 and the second exit signal SREX2 to generate a synthesis exit signal SREXSUM. The OR gate OR81 may generate the synthesis exit signal SREXSUM, which is enabled to have a logic "high" level when the first exit signal SREX1 or the second exit signal SREX2 is enabled to have a logic "high" level. The PMOS transistor P81 may be coupled between a power supply voltage VDD terminal and a node nd81 and may be turned on in response to the synthesis entry signal SRCSUMB. The PMOS transistor P81 may drive the period signal SREF_PD, outputted through the node nd81 to a logic "high" level, corresponding to the power supply voltage VDD, when the synthesis entry signal SRCSUMB is enabled to have a logic "low" level. The NMOS transistor N81 may be coupled between the node nd81 and a ground voltage VSS terminal and may be turned on in response to the synthesis exit signal SREXSUM. The NMOS transistor N81 may drive the period signal SREF_PD, outputted through the node nd81 to a logic "low" level, corresponding to the ground voltage VSS, when the synthesis exit signal SREXSUM is enabled to have a logic "high" level.

Operations of the semiconductor device 100 will be described hereinafter with reference to FIGS. 9 and 10.

Figure 9:
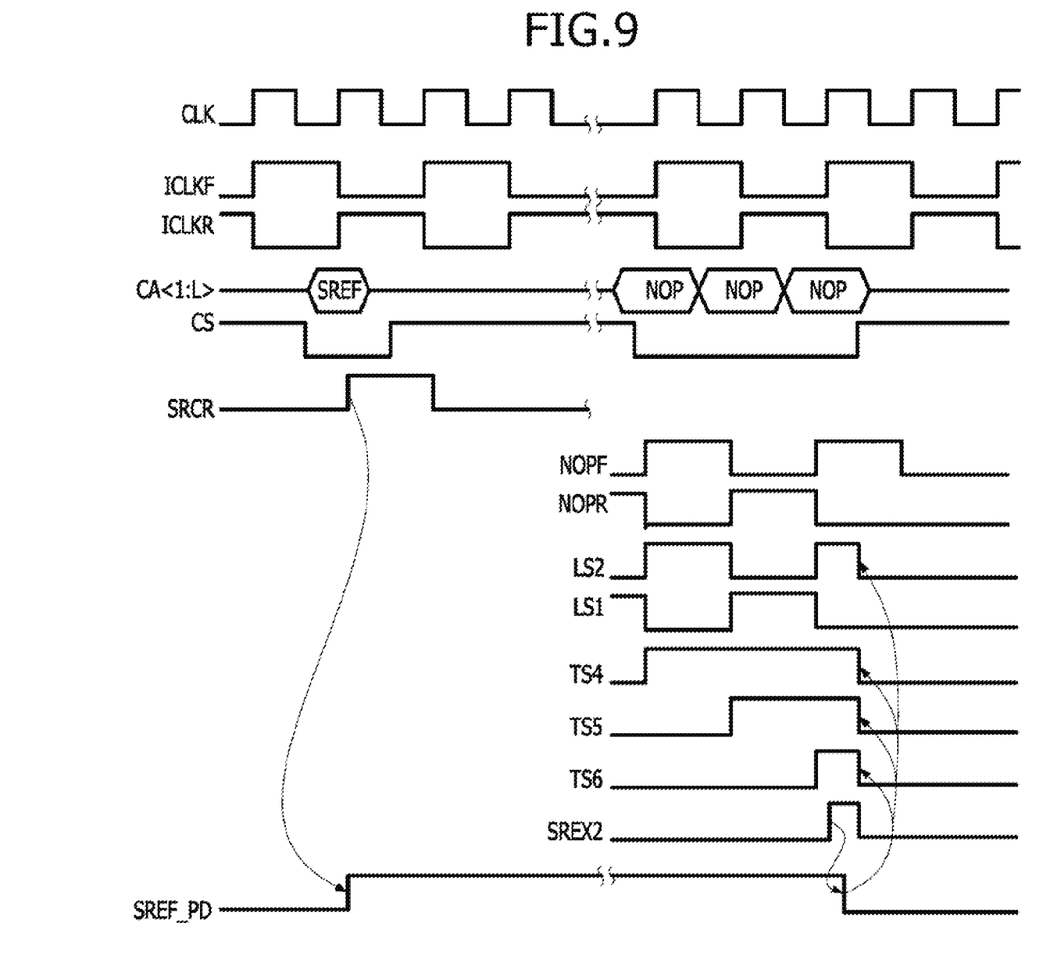
FIGS. 9 and 10 are timing diagrams, illustrating operations of the semiconductor device, shown in FIG. 1.

As illustrated in FIG. 9, when the external control signal CA<1:L>, having a logic level combination for activating a self-refresh operation SREF, is received by the memory device 100 in synchronization with a rising edge of the first internal clock signal ICLKR generated by dividing the clock signal CLK while the chip selection signal CS is set to have a logic "low" level, the first entry command SRCR enabled to have a logic "high" level may be generated. The period signal SREF_PD may be enabled to have a logic "high" level by the first entry command SRCR enabled to have a logic "high" level, thereby activating the refresh operation SREF.

As illustrated in FIG. 9, while the chip selection signal CS is set to have a logic "low" level, the second exit command NOPF enabled to have a logic "high" level may be generated when the external control signal CA<1:L>, having a logic level combination for an deactivation operation NOP, is received by the semiconductor device 100 in synchronization with a rising edge of the second internal clock signal ICLKF generated by dividing the clock signal CLK, and the first exit command NOPR enabled to have a logic "low" level may be generated when the external control signal CA<1:L>, having a logic level combination for the deactivation operation NOP, is received by the semiconductor device 100 in synchronization with a rising edge of the first internal clock signal ICLKR generated by dividing the clock signal CLK. While the period signal SREF_PD is enabled to have a logic "high" level, the second exit command NOPF may be successively latched at a rising edge of the second connection signal LS2, a rising edge of the first connection signal LS1, and a rising edge of the second connection signal LS2 to generate the fourth transfer signal TS4, the fifth transfer signal TS5, the sixth transfer signal TS6, and the second exit signal SREX2 which are sequentially enabled to have a logic "high" level. The period signal SREF_PD may be disabled to have a logic "low" level by the second exit signal SREX2 enabled to have a logic "high" level, thereby inactivating the refresh operation.

Figure 10:
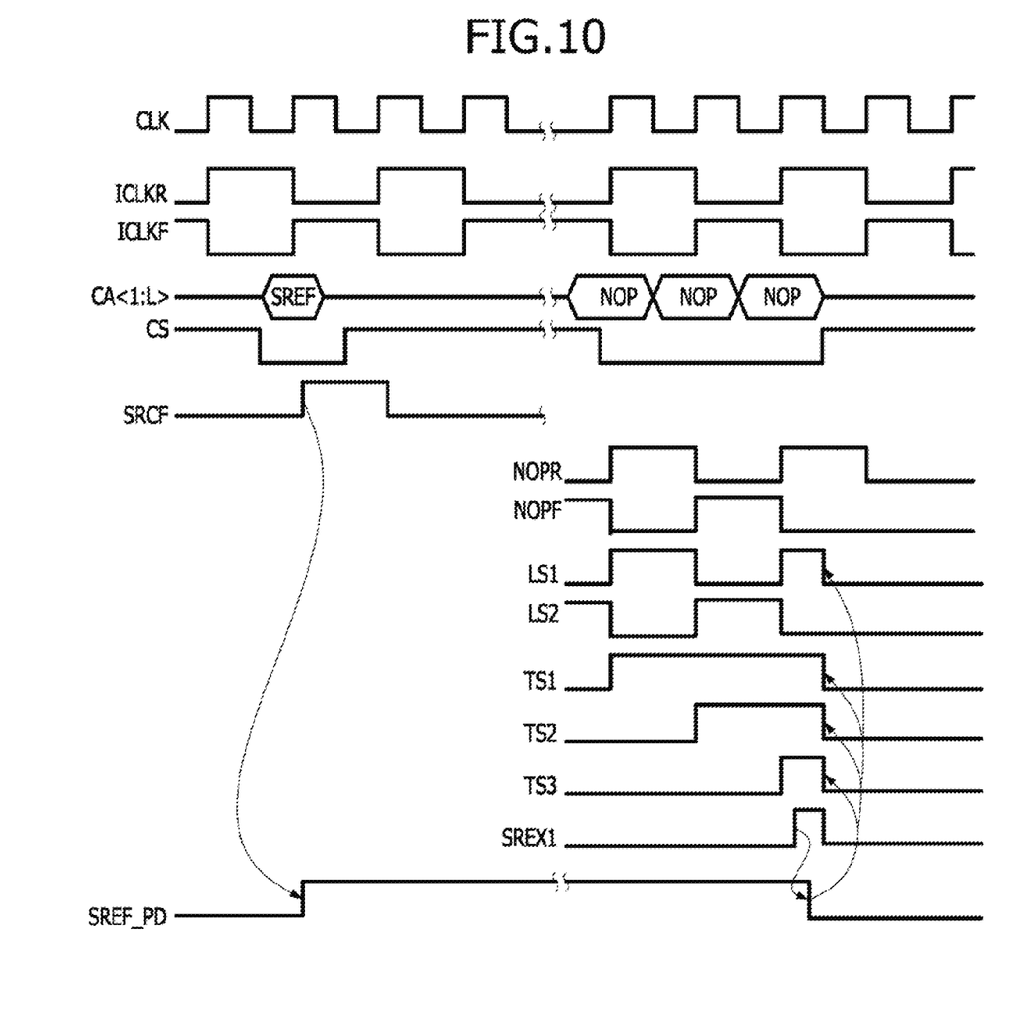

As illustrated in FIG. 10, when the external control signal CA<1:L>, having a logic level combination for activating the self-refresh operation SREF, is received by the memory device 100 in synchronization with a rising edge of the second internal clock signal ICLKF generated by dividing the clock signal CLK while the chip selection signal CS is set to have a logic "low" level, the second entry command SRCF enabled to have a logic "high" level may be generated. The period signal SREF_PD may be enabled to have a logic "high" level by the second entry command SRCF enabled to have a logic "high" level, thereby activating the refresh operation SREF.

As illustrated in FIG. 10, while the chip selection signal CS is set to have a logic "low" level, the first exit command NOPR enabled to have a logic "high" level may be generated when the external control signal CA<1:L> having a logic level combination for the deactivation operation NOP is received by the semiconductor device 100 in synchronization with a rising edge of the first internal clock signal ICLKR generated by dividing the clock signal CLK, and the second exit command NOPF enabled to have a logic "low" level may be generated when the external control signal CA<1:L> having a logic level combination for the deactivation operation NOP is received by the semiconductor device 100 in synchronization with a rising edge of the second internal clock signal ICLKF generated by dividing the clock signal CLK. While the period signal SREF_PD is enabled to have a logic "high" level, the first exit command NOPR may be successively latched at a rising edge of the first connection signal LS1, a rising edge of the second connection signal LS2, and a rising edge of the first connection signal LS1 to generate the first transfer signal TS1, the second transfer signal TS2, the third transfer signal TS3, and the first exit signal SREX1 which are sequentially enabled to have a logic "high" level. The period signal SREF_PD may be disabled to have a logic "low" level by the first exit signal SREX1 enabled to have a logic "high" level, thereby inactivating the refresh operation.

A semiconductor device according to an embodiment may generate commands for controlling various internal operations including a refresh entry operation, a refresh exit operation and the like from an external control signal inputted in synchronization with multiphase internal clock signals. Thus, even though the external control signal for generating the commands for the internal operations is inputted in synchronization with various phases, the internal operations may be stably controlled.

In addition, according to an embodiment, the external control signal inputted in synchronization with multiphase internal clock signals may be latched using a simple latch circuit to generate the commands for controlling the internal operations. Thus, it may be possible to save a layout area in designing a circuit for controlling the internal operations. This may lead to low power consumption of the semiconductor device.

Figure 11:
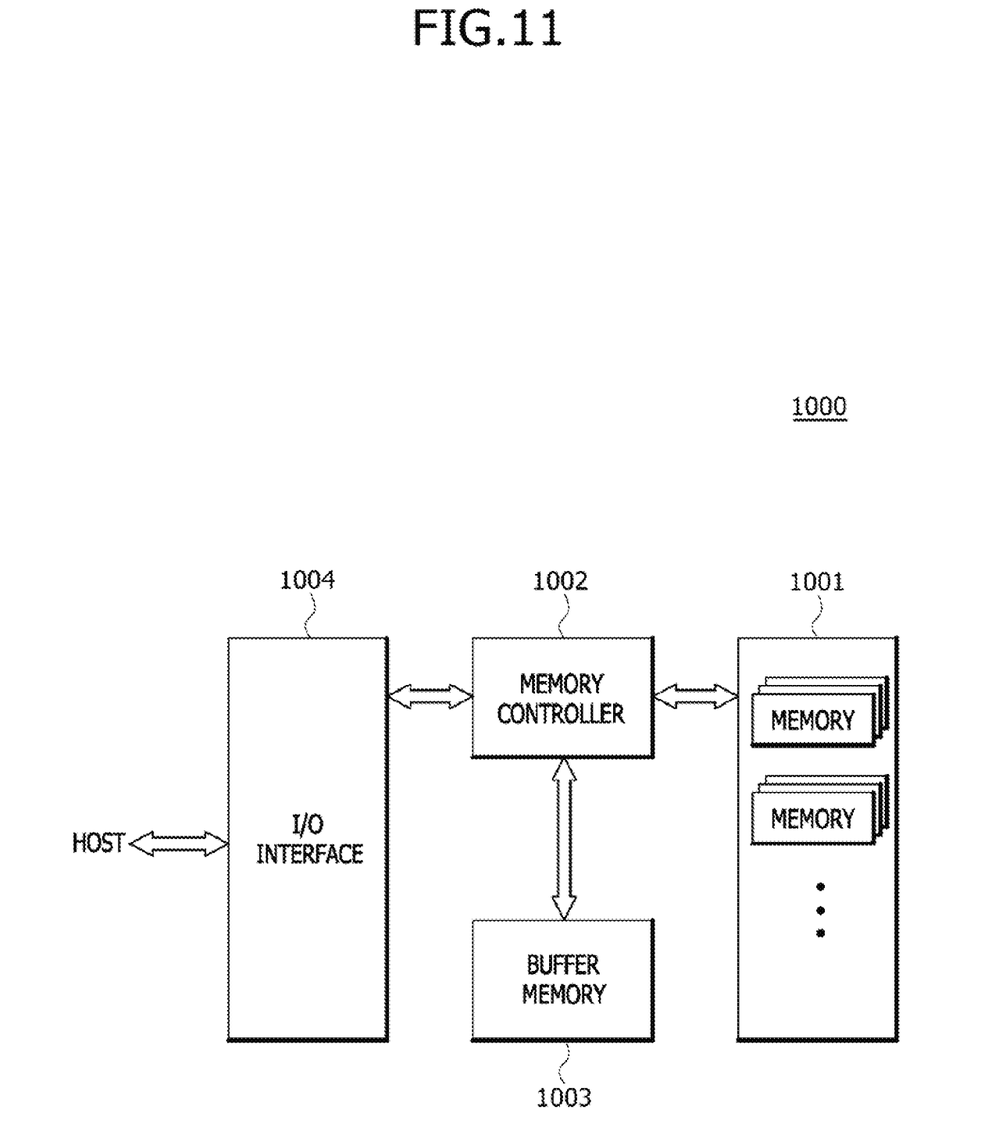
FIG. 11 is a block diagram, illustrating a configuration of an electronic system, including the semiconductor device shown in FIG. 1.

The semiconductor device 100 described with reference to FIG. 1 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be received by the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). The buffer memory 1003 may include the semiconductor device 100 illustrated in FIG. 1.

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a command decoder configured to generate a first entry command and a first exit command based on a first internal chip selection signal and a first internal control signal and configured to generate a second entry command and a second exit command based on a second internal chip selection signal and a second internal control signal; and
    a period signal generation circuit configured to generate a period signal based on the first entry command, the second entry command, the first exit command, the second exit command, and the period signal.

2. The semiconductor device of claim 1,
    wherein the first internal chip selection signal is generated by latching a chip selection signal in synchronization with a first internal clock signal; and
    wherein the first internal control signal is generated by latching an external control signal in synchronization with the first internal clock signal.

3. The semiconductor device of claim 2,
    wherein the second internal chip selection signal is generated by latching the chip selection signal in synchronization with a second internal clock signal; and
    wherein the second internal control signal is generated by latching the external control signal in synchronization with the second internal clock signal.

4. The semiconductor device of claim 3, wherein the first internal clock signal and the second internal clock signal are generated by dividing a clock signal.

5. The semiconductor device of claim 3, wherein a phase of the first internal clock signal is different from a phase of the second internal clock signal.

6. The semiconductor device of claim 1, wherein the period signal is enabled when the first entry command or the second entry command is enabled.

7. The semiconductor device of claim 1, wherein the period signal generation circuit generates a disabled period signal when the first exit command and the second exit command are sequentially enabled in the order of the first exit command and then the second exit command, while the period signal is enabled.

8. The semiconductor device of claim 1, wherein the period signal generation circuit generates a disabled period signal when the second exit command and the first exit command are sequentially enabled in the order of the second exit command and then the first exit command, while the period signal is enabled.

9. The semiconductor device of claim 1, wherein the period signal generation circuit includes:
a first exit signal generation circuit configured to generate a first exit signal which is enabled when a first connection signal and a second connection signal are sequentially generated while the period signal is enabled, wherein the first connection signal is generated from the first exit command, and the second connection signal is generated from the second exit command;
a second exit signal generation circuit configured to generate a second exit signal which is enabled when the second connection signal and the first connection signal are sequentially generated while the period signal is enabled; and
a period signal drive circuit configured to generate the disabled period signal based on the first exit signal and the second exit signal.

10. The semiconductor device of claim 9, wherein the first exit signal is generated based on a successive latching of the first exit command to the first connection signal, then the second connection signal, and then the first connection signal, and
wherein the second exit signal is generated based on a successive latching of the second exit command to the second connection signal, then the first connection signal, and then the second connection signal.

11. The semiconductor device of claim 9, wherein the first connection signal is generated by buffering the first exit command when the period signal is enabled.

12. The semiconductor device of claim 9, wherein the first exit signal generation circuit includes:
a first transfer signal latch configured to latch the first exit command based on the first connection signal to generate a first transfer signal; and
a second transfer signal latch configured to latch the first transfer signal based on the second connection signal to generate a second transfer signal.

13. The semiconductor device of claim 9,
wherein the period signal drive circuit is configured to drive the period signal based on a synthesis entry signal and a synthesis exit signal;
wherein the synthesis entry signal is generated by synthesizing the first entry command and the second entry command; and
wherein the synthesis exit signal is generated by synthesizing the first exit signal and the second exit signal.

14. A semiconductor device comprising:
a first exit signal generation circuit configured to generate a first exit signal which is enabled when a first connection signal and a second connection signal are sequentially generated while a period signal is enabled, wherein the first connection signal is generated from a first exit command, and the second connection signal is generated from a second exit command;
a second exit signal generation circuit configured to generate a second exit signal which is enabled when the second connection signal and the first connection signal are sequentially generated while the period signal is enabled; and
a period signal drive circuit configured to generate a disabled period signal which is disabled based on the first exit signal and the second exit signal.

15. The semiconductor device of claim 14, wherein the first exit signal is generated based on a successive latching of the first exit command to the first connection signal, then the second connection signal, and then the first connection signal, and
wherein the second exit signal is generated based on a successive latching of the second exit command to the second connection signal, then the first connection signal, and then the second connection signal.

16. The semiconductor device of claim 14, wherein the period signal is enabled when a first entry command or a second entry command is enabled.

17. The semiconductor device of claim 16,
wherein the first entry command and the first exit command are generated based on a first internal chip selection signal and a first internal control signal; and
wherein the second entry command and the second exit command are generated based on a second internal chip selection signal and a second internal control signal.

18. The semiconductor device of claim 17,
wherein the first internal chip selection signal is generated by latching a chip selection signal in synchronization with a first internal clock signal;
wherein the first internal control signal is generated by latching an external control signal in synchronization with the first internal clock signal;
wherein the second internal chip selection signal is generated by latching the chip selection signal in synchronization with a second internal clock signal; and
wherein the second internal control signal is generated by latching the external control signal in synchronization with the second internal clock signal.

19. The semiconductor device of claim 18, wherein the first internal clock signal and the second internal clock signal are generated by dividing a clock signal.

20. The semiconductor device of claim 14, wherein the first connection signal is generated by buffering the first exit command when the period signal is enabled.

21. The semiconductor device of claim 14, wherein the first exit signal generation circuit includes:
a first transfer signal latch configured to latch the first exit command based on the first connection signal to generate a first transfer signal; and
a second transfer signal latch configured to latch the first transfer signal based on the second connection signal to generate a second transfer signal.

22. The semiconductor device of claim 14,
wherein the period signal drive circuit is configured to drive the period signal based on a synthesis entry signal and a synthesis exit signal;
wherein the synthesis entry signal is generated by synthesizing a first entry command and a second entry command; and
wherein the synthesis exit signal is generated by synthesizing the first exit signal and the second exit signal.

* * * * *